(12) United States Patent
Bang et al.

(10) Patent No.: US 11,733,077 B2
(45) Date of Patent: Aug. 22, 2023

(54) CARRIER FOR MEASUREMENT AND WAFER TRANSFER SYSTEM INCLUDING THE SAME

(71) Applicant: SAMSUNG ELECTRONICS CO., LTD., Suwon-si (KR)

(72) Inventors: Sanga Bang, Hwaseong-si (KR); Geunhyung Kim, Hwaseong-si (KR); Sangmin Kim, Hwaseong-si (KR); Gi-Nam Park, Incheon (KR); Chul-Jun Park, Seoul (KR); Yong-Jun Ahn, Suwon-si (KR); JongJin Ahn, Hwaseong-si (KR); Min Kyun Lee, Suwon-si (KR); Sangkyung Lee, Hwaseong-si (KR); Kyubum Cho, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 151 days.

(21) Appl. No.: 17/504,212

(22) Filed: Oct. 18, 2021

(65) Prior Publication Data

US 2022/0307877 A1    Sep. 29, 2022

(30) Foreign Application Priority Data

Mar. 29, 2021 (KR) .................. 10-2021-0040655

(51) Int. Cl.
*G01F 1/42* (2006.01)
*G01F 1/37* (2006.01)

(52) U.S. Cl.
CPC . *G01F 1/42* (2013.01); *G01F 1/37* (2013.01)

(58) Field of Classification Search
CPC ... G01F 1/42; G01F 1/37; G01F 15/06; H01L 21/67253; H01L 21/67393; H01L 21/67389; H01L 21/67766; H01L 21/6735; H01L 21/6773; G01C 9/02; G01L 13/00; G01N 15/02
See application file for complete search history.

(56) References Cited

U.S. PATENT DOCUMENTS

| 9,868,140 B2 * | 1/2018 | Rebstock .......... H01L 21/67017 |
| 10,006,894 B2 * | 6/2018 | Abe .................. G01N 33/0009 |
| 10,228,394 B2 | 3/2019 | Montijo |
| 10,790,176 B2 | 9/2020 | Bae et al. |
| 10,790,177 B2 | 9/2020 | Lin et al. |
| 10,964,570 B2 * | 3/2021 | Lee ......................... B05B 1/30 |

(Continued)

FOREIGN PATENT DOCUMENTS

| KR | 20000002109 A | 1/2000 |
| KR | 100396468 B1 | 9/2003 |

(Continued)

*Primary Examiner* — Freddie Kirkland, III
(74) *Attorney, Agent, or Firm* — Myers Bigel, P.A.

(57) ABSTRACT

A measurement carrier includes a housing having an internal space, and a flow-rate measuring device located within the internal space. A bottom surface of the housing includes a first inflow hole, a second inflow hole, and an outflow hole, which provide fluid communication between the internal space and an outer space. The flow-rate measuring device may include a first flow-rate measuring sensor in fluid communication with the first inflow hole, and a second flow-rate measuring sensor in fluid communication with the second inflow hole.

20 Claims, 7 Drawing Sheets

(56) References Cited

U.S. PATENT DOCUMENTS

| | | | |
|---|---|---|---|
| 2002/0174709 A1* | 11/2002 | Kim | G01N 1/2273 |
| | | | 73/31.01 |
| 2012/0235793 A1 | 9/2012 | Yi et al. | |
| 2015/0369643 A1* | 12/2015 | Murata | H01L 21/67769 |
| | | | 73/861.08 |
| 2016/0370797 A1 | 12/2016 | Varya et al. | |
| 2017/0365531 A1 | 12/2017 | Tedeschi et al. | |
| 2018/0074031 A1* | 3/2018 | Abe | G01F 1/28 |
| 2018/0161830 A1 | 6/2018 | Sasaki et al. | |
| 2018/0190522 A1 | 7/2018 | Kim et al. | |
| 2018/0358249 A1 | 12/2018 | Nagaike | |
| 2020/0033308 A1 | 1/2020 | Kotsugai et al. | |
| 2020/0176293 A1* | 6/2020 | Lee | H01L 21/67017 |

FOREIGN PATENT DOCUMENTS

| | | | |
|---|---|---|---|
| KR | 20050111943 A | 11/2005 | |
| KR | 101565091 B1 | 11/2015 | |
| KR | 20180009059 A | 1/2018 | |
| KR | 101876416 B1 | 7/2018 | |
| KR | 20180078419 A | 7/2018 | |
| KR | 20190011316 A | 2/2019 | |
| KR | 102021007 B1 | 9/2019 | |
| KR | 102036252 B1 | 10/2019 | |
| KR | 102135264 B1 | 7/2020 | |

\* cited by examiner

CARRIER FOR MEASUREMENT AND WAFER TRANSFER SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0040655, filed on Mar. 29, 2021, in the Korean Intellectual Property Office, the entire contents of which are hereby incorporated by reference.

BACKGROUND OF THE INVENTION

A semiconductor device is fabricated through several unit processes. For example, the semiconductor device is fabricated by performing an exposure process, a deposition process, and an etching process on a semiconductor wafer. If each of the fabrication processes is finished, the semiconductor wafer is transferred from system to system. Various apparatuses are used to transfer the semiconductor wafer. For example, the semiconductor wafer may be transferred using an auto-guided vehicle (AGV) or an overhead hoist transfer (OHT). The OHT is transferred along a rail, which is provided above a semiconductor fabrication system, to transfer the semiconductor wafer. To transfer the semiconductor wafer using the OHT, it is necessary to use a wafer carrier, which is configured to contain the semiconductor wafer.

SUMMARY

An embodiment of the inventive concept provides a measurement carrier, which is configured to measure an amount of particles in gas supplied into a carrier from a carrier base and to measure a flow rate of the gas, and a wafer transfer system including the same.

An embodiment of the inventive concept provides a measurement carrier, which is configured to inspect a tilting state of the carrier base, and a wafer transfer system including the same.

An embodiment of the inventive concept provides a measurement carrier, which is configured to inspect a connection state between the carrier base and the carrier, and a wafer transfer system including the same.

An embodiment of the inventive concept provides a measurement carrier, which is configured to precisely measure an amount of particles in gas supplied into the carrier and a flow rate of the gas, and a wafer transfer system including the same.

According to an embodiment of the inventive concept, a measurement carrier includes a housing having an internal space, and a flow-rate measuring device located in the internal space. A bottom surface of the housing includes a first inflow hole, a second inflow hole, and an outflow hole, each of which provides fluid communication between the internal space and an outer space. The flow-rate measuring device may include a first flow-rate measuring sensor in fluid communication with the first inflow hole, and a second flow-rate measuring sensor in fluid communication with the second inflow hole.

According to an embodiment of the inventive concept, a measurement carrier includes a housing having an internal space and a particle measurement device located within the housing. A bottom surface of the housing includes a first inflow hole, a second inflow hole, a third inflow hole, and an outflow hole, each of which provides fluid communication between the internal space and an outer space. The particle measurement device includes a first conduit in fluid communication with the first inflow hole, a second conduit in fluid communication with the second inflow hole, a third conduit in fluid communication with the third inflow hole, a measurement conduit in fluid communication with each of the first conduit, the second conduit, and the third conduit, and a particle measuring sensor in fluid communication with the measurement conduit.

According to an embodiment of the inventive concept, a wafer transfer system includes a carrier having an internal space, a transfer device configured to transfer the carrier, a carrier base configured to receive the carrier thereon, and a gas supplying apparatus in fluid communication with the carrier base and configured to supply a gas into the carrier. The carrier may include a wafer carrier configured to receive a wafer, a flow-rate measure carrier configured to measure a flow rate of the gas, and a particle measure carrier configured to measure an amount of particles in the gas. The carrier base includes a supply hole and an exhaust hole, each of which are in fluid communication with the gas supplying apparatus and are exposed near a top surface of the carrier base. Each of the wafer carrier, the flow-rate measure carrier, and the particle measure carrier includes a respective inflow hole configured to be in fluid communication with the supply hole and a respective outflow hole configured to be in fluid communication with the exhaust hole. The flow-rate measure carrier may include a flow-rate measuring sensor, and the particle measure carrier may include a particle measuring sensor.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
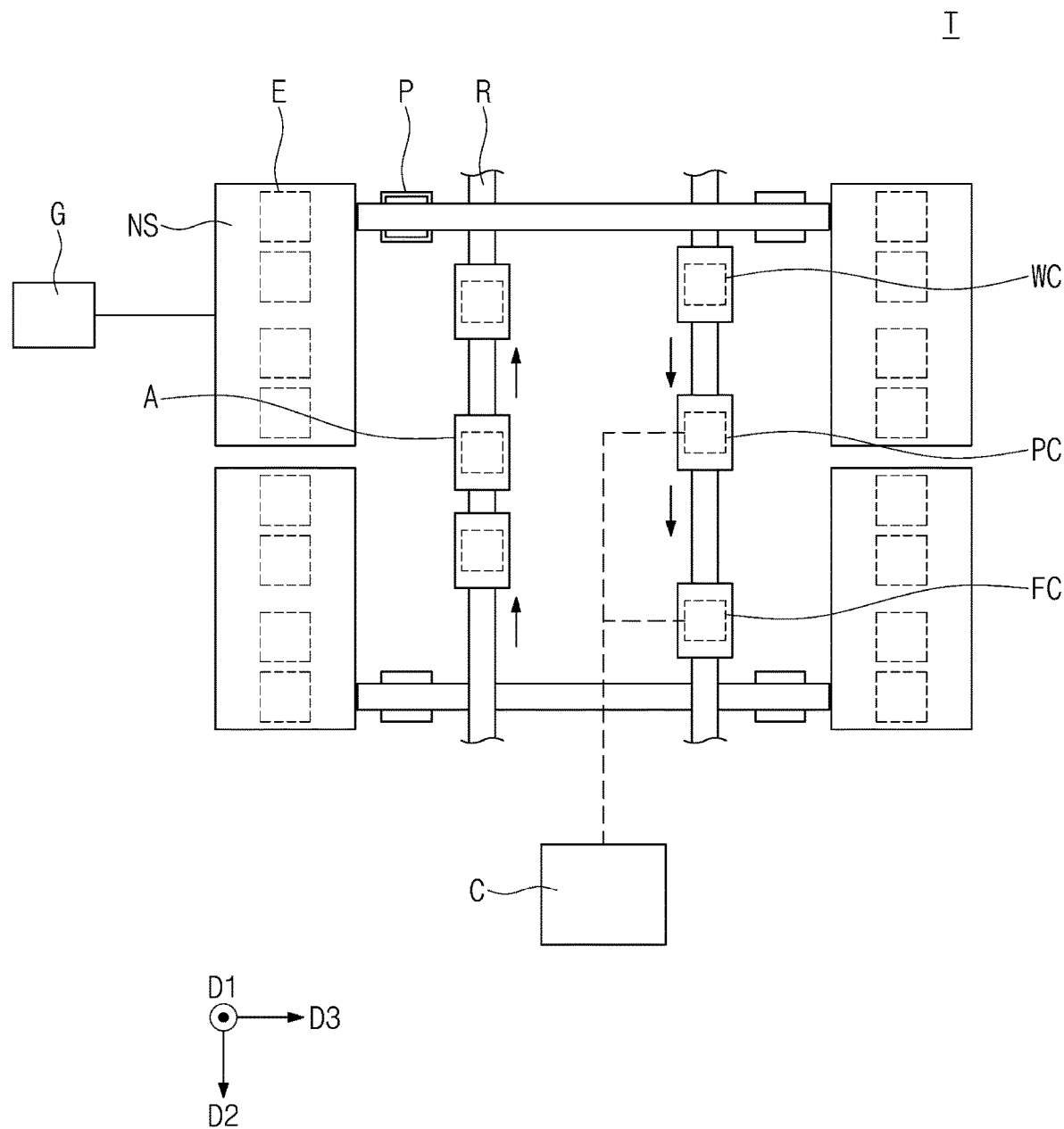
FIG. 1 is a schematic diagram illustrating a measurement carrier and a wafer transfer system including the same, according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Like reference numerals in the drawings denote like elements, and thus their description will be omitted.

FIG. 1 is a schematic diagram illustrating a measurement carrier and a wafer transfer system including the same, according to an embodiment of the inventive concept.

Hereinafter, the reference characters "D1" and "D2" of FIG. 1 will be used to denote first and second directions, respectively, which are not parallel to each other, and the reference character "D3" will be used to denote as a third direction, which is depicted to cross the first and second directions D1 and D2.

Referring to FIG. 1, a wafer transfer system T may be provided. The wafer transfer system T may be used to perform a fabrication process on a semiconductor wafer. For example, the wafer transfer system T may be configured to transfer the semiconductor wafer or to store the semiconductor wafer at a certain place for a certain period of time. More specifically, the semiconductor wafer may be transferred from one fabrication system to another fabrication system by the wafer transfer system T. In addition, the semiconductor wafer may be kept at a certain position by the wafer transfer system T. The wafer transfer system T may include a storage device NS, a carrier base E, a port P, a gas supplying apparatus G, a rail R, a transfer device A, a carrier, and a control unit C.

The storage device NS may be configured to store a wafer. The wafer may be stored or kept in the storage device NS for a certain period of time. The storage device NS may be connected to the port P. The wafer may be loaded on or unloaded from the storage device NS via the port P. The storage device NS may include the carrier base E. In an embodiment, the storage device NS may include a plurality of carrier bases E. The storage device NS may include a stocker and/or a side track buffer (STB), but the inventive concept is not limited to this example.

The carrier may be disposed on the carrier base E. For example, the carrier may be loaded on the carrier base E and then may be kept on the carrier base E for a certain period of time. The carrier base E may be provided in the storage device NS. The carrier base E may be connected to and in fluid communication with the gas supplying apparatus G. Gas from the gas supplying apparatus G may be supplied to the carrier base E. For example, an inactive or inert gas may be supplied to the carrier base E from the gas supplying apparatus G and may be supplied into the carrier loaded on the carrier base E. An inner space of the carrier may be filled with the gas supplied from the gas supplying apparatus G. In an embodiment, the inactive gas, which is supplied from the gas supplying apparatus G, may include nitrogen (N2) gas and/or argon (Ar) gas, but the inventive concept is not limited to this example. In an embodiment, a plurality of carrier bases E may be provided. For example, a plurality of carrier bases E may be provided in a single storage device NS. The carrier bases E may be connected to a single gas supplying apparatus G. In other words, the gas in the single gas supplying apparatus G may be supplied into each of the carrier bases E. However, in the following description, the carrier base E will be referred to as a singular element, for brevity's sake. The carrier base E will be described in more detail with reference to FIGS. 2 and 3.

The port P may be placed in front of the storage device NS. The carrier may be disposed in or unloaded from the storage device NS via the port P. For example, the port P may be configured to receive the carrier from the transfer device A and to transfer the carrier to the storage device NS. The port P may also be configured to receive the carrier from the storage device NS and to transfer the carrier to the transfer device A.

The gas supplying apparatus G may be connected to and in fluid communication with the storage device NS. More specifically, the gas supplying apparatus G may be connected to and in fluid communication with the carrier base E. The gas may be supplied into the carrier, which is disposed on the carrier base E, by the gas supplying apparatus G. For this, the gas supplying apparatus G may include a gas storage, a compressor, a regulator, and a supply pressure measuring sensor. The gas storage may store the gas, which will be supplied to the carrier. The compressor may be used to transfer the gas in the gas storage. The regulator may be configured to adjust pressure of the gas, which will be supplied to the carrier base E. The supply pressure measuring sensor may be coupled to the regulator. The supply pressure measuring sensor may be configured to measure a supply pressure of the gas. For example, the supply pressure measuring sensor may measure a flow rate of the gas, which is actually supplied from the gas supplying apparatus G. In an embodiment, the gas supplying apparatus G may include a plurality of supply pressure measuring sensors. For example, the supply pressure measuring sensors may be provided at front and rear ends of the regulator. Accordingly, it may be possible to monitor whether a pressure adjusting operation of the regulator is normally performed. For example, by comparing pressures of the gases entering and being exhausted from the regulator, it may be possible to check the performance of the regulator and to precisely control an operation of the regulator. In an embodiment, the gas supplying apparatus G may be connected to and in fluid communication with a plurality of the carrier bases E. In this case, a single gas supplying apparatus G may be used to supply the gas to the plurality of the carrier bases E.

The rail R may be extended along the storage device NS and a semiconductor fabrication system (not shown). The transfer device A may be configured to move along the rail R. The rail R may be provided on a floor or ceiling of the production line.

The transfer device A may be used to transfer the carrier. The transfer device A may be configured to move along the rail R. In the case where the rail R is installed near a ceiling, the transfer device A may be an overhead hoist transfer (OHT). However, the inventive concept is not limited to this example, and in an embodiment, the transfer device A may include an automated guided vehicle (AGV) or the like.

The carrier may be transferred from system to system by the transfer device A. The carrier may be stored in the storage device NS for a certain period of time. More specifically, the carrier may be loaded on the carrier base E in the storage device NS and may be stored in the storage device NS for a certain period of time. The carrier may be a wafer carrier WC and another carrier, which is used for measurement and will be referred to as a measurement carrier. The measurement carrier may be a carrier, which is used for particle measurement and will be referred to as a particle measure carrier PC, and a carrier, which is used for flow rate measurement and will be referred to as a flow-rate measure carrier FC.

The wafer carrier WC may be used to carry a wafer. The wafer may be inserted in the wafer carrier WC. In an embodiment, a plurality of wafers may be inserted in a single wafer carrier WC. The wafers may be placed in the wafer carrier WC in steps of transferring or storing the wafers. The wafer carrier WC may be loaded on the carrier base E, when the wafer carrier WC is stored in the storage device NS. In the case where the wafer carrier WC is loaded on the carrier base E, the gas may be supplied to the wafer carrier WC from the gas supplying apparatus G. Due to the gas filling the wafer carrier WC, it may be possible to prevent the wafer in the wafer carrier WC from being damaged. More specifically, if an inner space of the wafer carrier WC is filled with an inert gas, it may be possible to prevent the wafer from being damaged and/or oxidized. In an embodiment, a plurality of wafer carriers WC may be provided. More specifically, other carriers, in addition to the particle measure carrier PC and the flow-rate measure carrier FC, may be used in wafer transfer system T. However, in the following description, the wafer carrier WC will be referred to as a singular element, for brevity's sake.

The particle measure carrier PC may have an outer appearance that is similar to the wafer carrier WC. The particle measure carrier PC may include a particle measuring sensor. If the particle measure carrier PC is disposed on the carrier base E, the particle measuring sensor may measure particles in gas, which is supplied through the carrier base E. Thus, a state of the gas supplied from the carrier base E may be examined by the particle measure carrier PC. This will be described in more detail below. In an embodiment, a plurality of particle measure carriers PC may be provided. The number of the particle measure carriers PC may be smaller than that of the wafer carriers WC. In the following description, the particle measure carrier PC will be referred to as the singular element, for the sake of brevity.

The flow-rate measure carrier FC may have an outer appearance that is similar to the wafer carrier WC. The flow-rate measure carrier FC may include a flow-rate measuring sensor. If the flow-rate measure carrier FC is disposed on the carrier base E, the flow-rate measuring sensor may measure a flow rate of gas, which is supplied through the carrier base E. Thus, a state of the gas supplied from the carrier base E may be examined by the flow-rate measure carrier FC. This will be described in more detail below. In an embodiment, a plurality of flow-rate measure carriers FC may be provided. The number of the flow-rate measure carrier FC may be smaller than that of the wafer carrier WC. In the following description, the flow-rate measure carrier FC will be referred to as the singular element, for the sake of brevity.

The control unit C may be connected to the gas supplying apparatus G, the transfer device A, and the carrier. The control unit C may control them or may receive signals from them. For example, the control unit C may receive measurement results, which are measured by the sensor, from the measurement carrier. The control unit C may determine a state of the carrier base E, based on information on the measurement results provided from the measurement carrier. This will be described in more detail below.

In the measurement carrier according to an embodiment of the inventive concept and the wafer transfer system including the same, when the gas is supplied into the carrier loaded on the carrier base, a supply state of the gas may be inspected using the sensor. More specifically, a flow rate of the gas and an amount of particles in the gas may be measured. Thus, it may be possible to prevent the wafer in the carrier from being damaged when the gas is insufficiently supplied or when many particles are contained in the gas.

In the measurement carrier according to an embodiment of the inventive concept and the wafer transfer system including the same, the wafer carrier and the measurement carrier may be separately provided. Thus, there is no need to reserve a space for the wafer inside the measurement carrier. Accordingly, a large volume sensor may be placed in a carrier of small size.

In the measurement carrier according to an embodiment of the inventive concept and the wafer transfer system including the same, two different carriers may be separately provided to measure a flow rate of gas and an amount of particles. Thus, both of a flow-rate measuring process and a particle measuring process may be precisely performed. That is, it may be possible to prevent an interference issue, which may occur when both of the two sensors are provided in a single carrier. Accordingly, a process of inspecting a state of the carrier base may be performed more accurately.

In the measurement carrier according to an embodiment of the inventive concept and the wafer transfer system including the same, all of the carrier bases may be inspected by using only a few measurement carriers. In other words, it may be possible to inspect all of the carrier bases, even when the sensors are provided in some of the carriers, not in all of the carrier bases.

Figure 2:
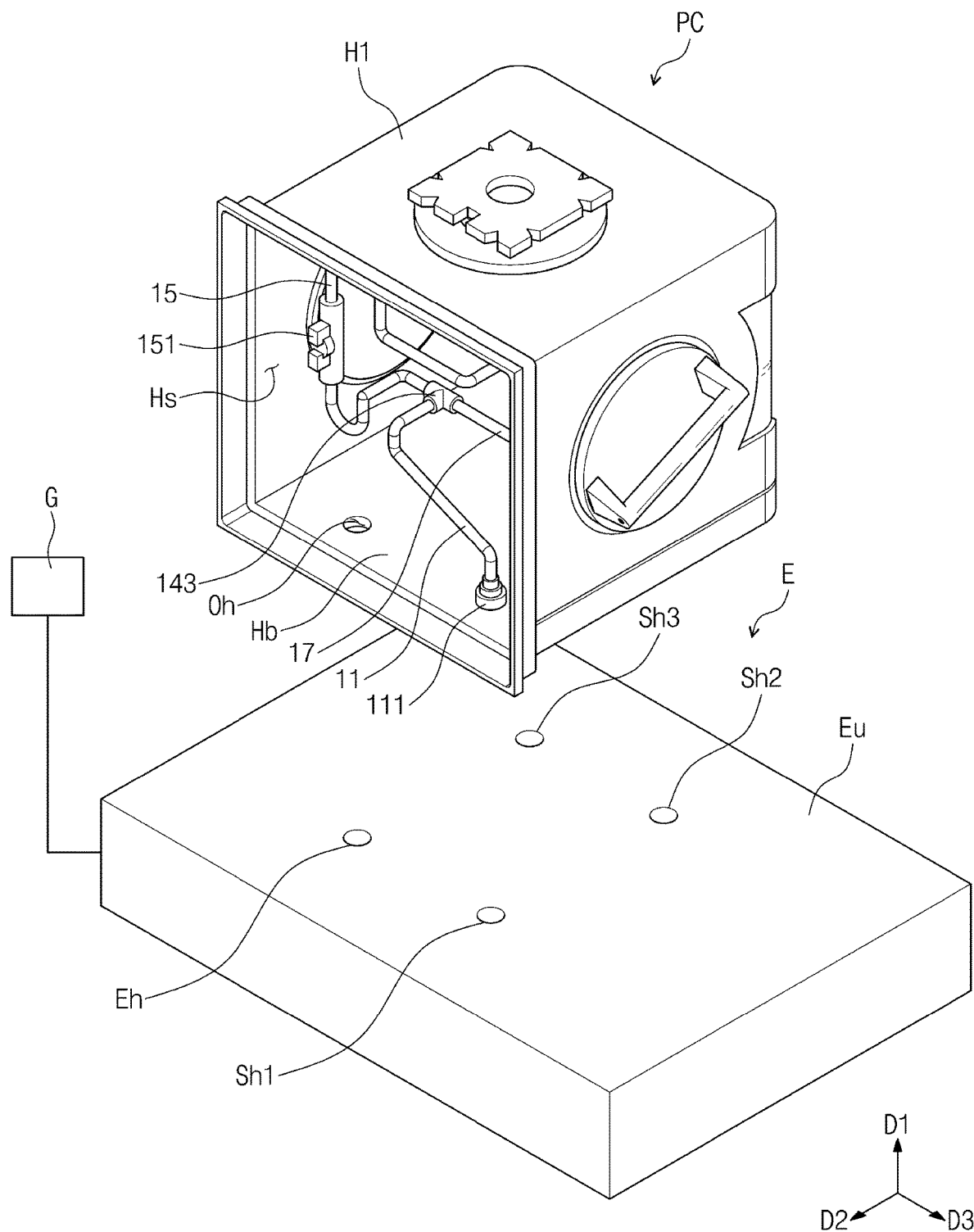
FIGS. 2 and 3 are perspective views illustrating a measurement carrier, which is loaded on a carrier base, according to an embodiment of the inventive concept.
Figure 3:
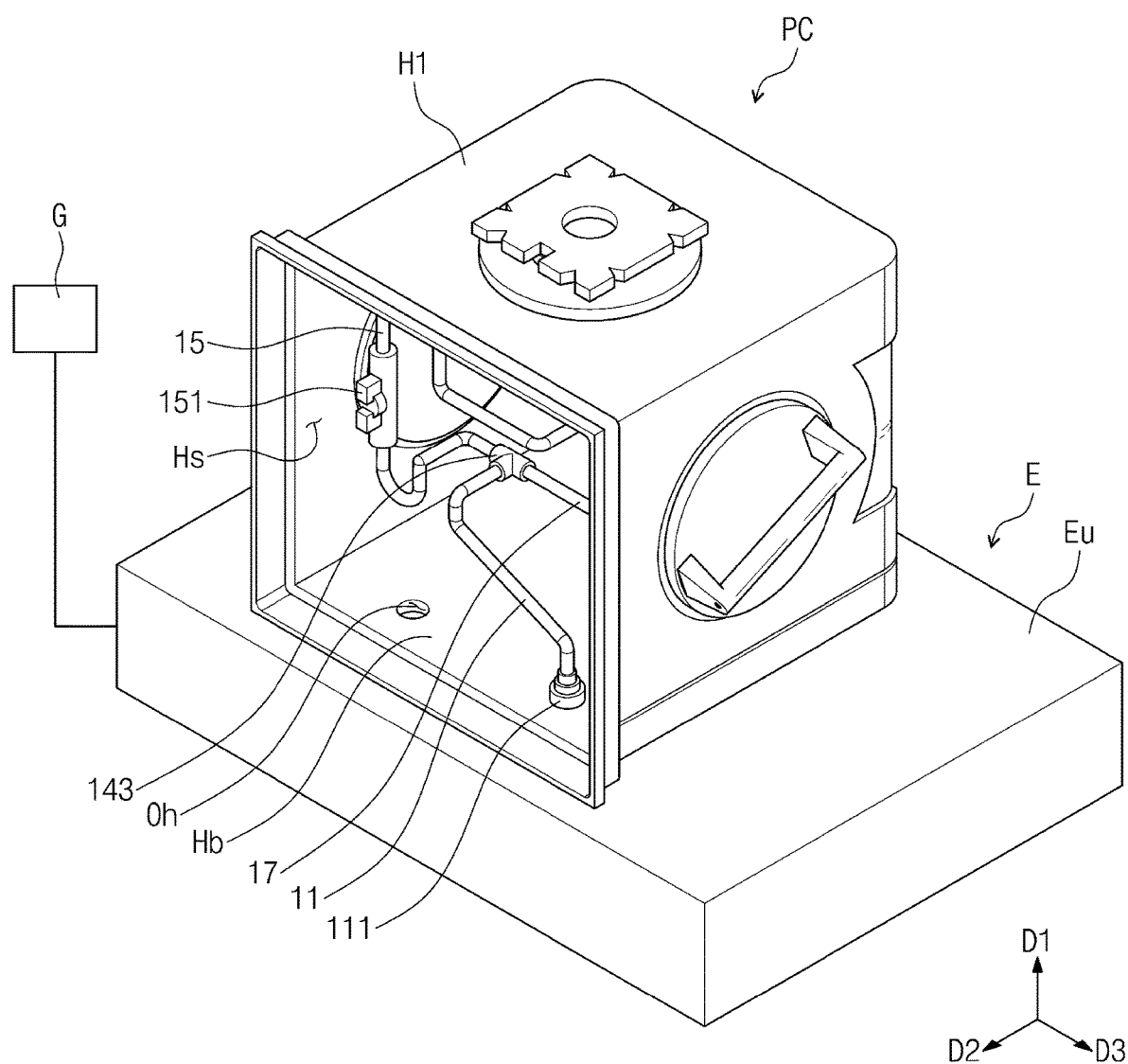
Figure 4:
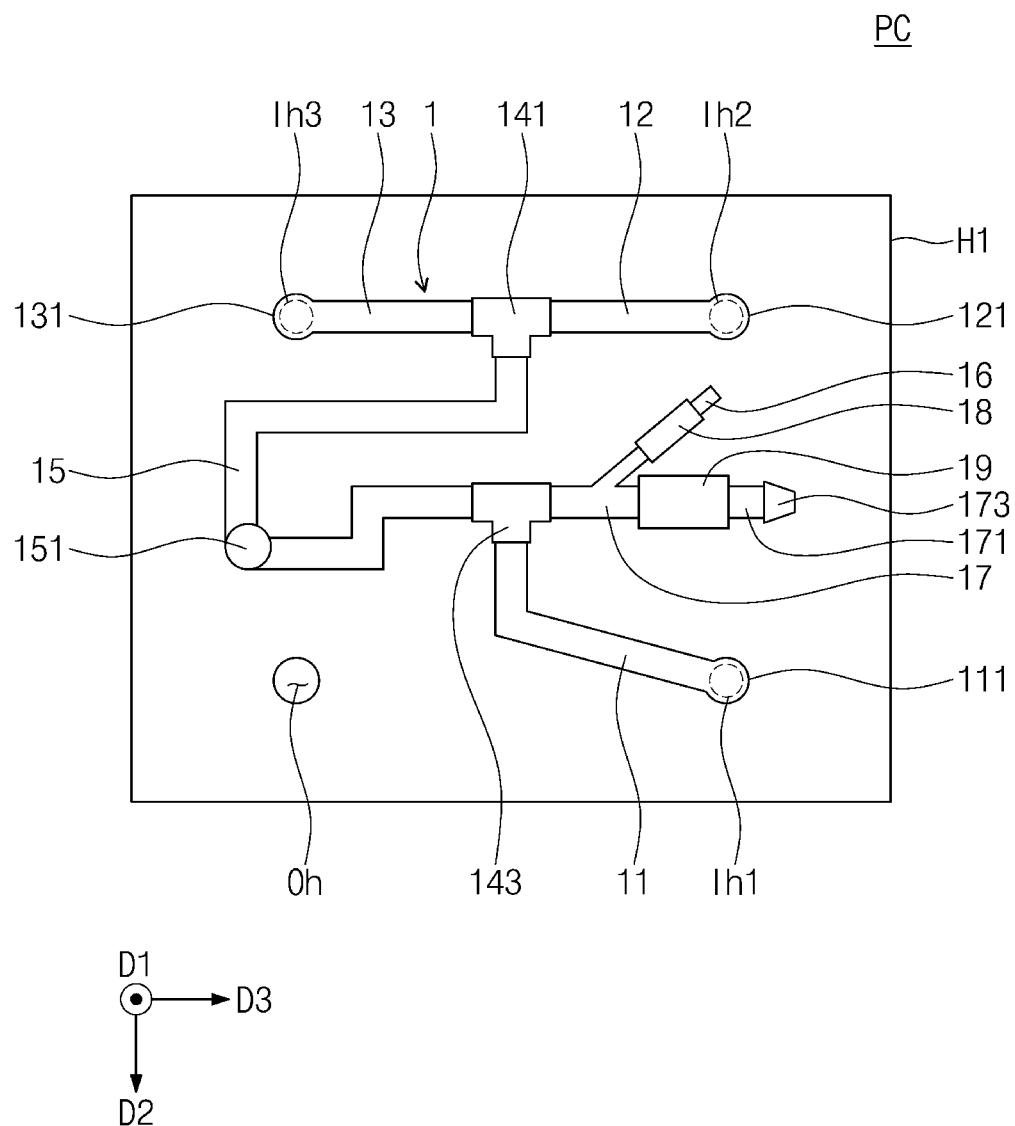
FIG. 4 is a plan view illustrating a particle measure carrier, according to an embodiment of the inventive concept.

FIGS. 2 and 3 are perspective views illustrating a measurement carrier, which is loaded on a carrier base, according to an embodiment of the inventive concept, and FIG. 4 is a plan view illustrating a particle measure carrier, according to an embodiment of the inventive concept.

Referring to FIGS. 2 and 3, the particle measure carrier PC may be loaded on a top surface Eu of the carrier base E.

The carrier base E may have supply holes Sh1, Sh2, and Sh3 and an exhaust hole Eh formed therein as illustrated. The supply holes Sh1, Sh2, and Sh3 and the exhaust hole Eh may be exposed to the outside near the top surface Eu. The supply holes Sh1, Sh2, and Sh3 and the exhaust hole Eh may be connected to and in fluid communication with the gas supplying apparatus G. Gas may be supplied to the supply holes Sh1, Sh2, and Sh3 and the exhaust hole Eh by the gas supplying apparatus G. In some embodiments, multiple supply holes Sh1, Sh2, and Sh3 may be provided (i.e., provided in plural). For example, the number of the supply holes Sh1, Sh2, and Sh3 may be three. Hereinafter, the three supply holes may be referred to as a first supply hole Sh1, a second supply hole Sh2, and a third supplying part Sh3, respectively. However, the inventive concept is not limited to this example, and in an embodiment, the number of the supply holes may not be three. The carrier base E may further include a base flow-rate measuring sensor (not shown). The base flow-rate measuring sensor may be connected to and in fluid communication with the supply holes Sh1, Sh2, and Sh3. More specifically, the base flow-rate measuring sensor may be connected to and in fluid communication with a single conduit, from which the supply holes Sh1, Sh2, and Sh3 branch off. The base flow-rate measuring sensor may measure a flow rate of gas which is exhausted from the carrier base E through the supply holes. The carrier base E may further include a base differential pressure sensor (not shown). The base differential pressure sensor may be connected to and in fluid communication with the exhaust hole Eh. The base differential pressure sensor may measure a difference between a pressure of gas, which is exhausted from the carrier through the exhaust hole Eh, and a pressure of an outer space. This difference may be used to determine a state of the gas, which is exhausted to the outer space through the exhaust hole Eh of the carrier base E.

Referring to FIG. 4, the particle measure carrier PC may include a housing H1, a particle measurement device 1, a power supplying part, a board, a transceiver, and a tilt sensor.

An outer appearance of the particle measure carrier PC may be defined by the housing H1. The housing H1 may have an internal space Hs (e.g., see FIG. 2). A first inflow hole Ih1, a second inflow hole Ih2, a third inflow hole Ih3, and an outflow hole Oh may be provided in a bottom surface Hb (e.g., see FIG. 2) of the housing H1. The internal space Hs may be connected to the outer space through the first inflow hole Ih1, the second inflow hole Ih2, the third inflow hole Ih3, and the outflow hole Oh. More specifically, the internal space Hs may be connected to a space below the housing H1 through the first inflow hole Ih1, the second inflow hole Ih2, the third inflow hole Ih3, and the outflow hole Oh. In the case where the particle measure carrier PC is placed on the carrier base E (e.g., see FIG. 2), each of the inflow holes may be connected to a corresponding one of the supply holes. The outflow hole Oh may be connected to the exhaust hole Eh. The gas may be supplied into the internal space Hs through the supply holes and the inflow holes. An example in which three inflow holes are provided has been described, but the inventive concept is not limited to this example. For example, the number of the inflow holes may be one, two, four or more.

The particle measurement device 1 may be placed in the internal space Hs. The particle measurement device 1 may be connected to and in fluid communication with the inflow hole. By using the particle measurement device 1, it may be possible to measure an amount of particles, which are contained in gas entering the internal space Hs. The particle measurement device 1 may measure an amount of particles in gas and may transmit information on the measured results to the control unit C (e.g., see FIG. 1). The particle measurement device 1 may include a first nozzle 111, a second nozzle 121, a third nozzle 131, a first conduit 11, a second conduit 12, a third conduit 13, a first connecting portion 141, a connection conduit 15, a valve 151, a second connecting portion 143, a measurement conduit 17, a branch conduit 16, an additional flow-rate measuring sensor 18, a particle measuring sensor 19, and a measurement pump 173.

The first nozzle 111 may be provided on and in fluid communication with the first inflow hole Ih1 and may be coupled to the bottom surface of the housing H1. The first nozzle 111 may connect the first inflow hole Ih1 to the first conduit 11 (i.e., cause fluid communication between the first inflow hole Ih1 and the first conduit 11). Gas may be supplied from the first inflow hole Ih1 through the first nozzle 111. The second nozzle 121 may be provided on and in fluid communication with the second inflow hole Ih2 and may be coupled to the bottom surface of the housing H1. The second nozzle 121 may connect the second inflow hole Ih2 to the second conduit 12 (i.e., cause fluid communication between the second inflow hole Ih2 and the second conduit 12). The gas may be supplied from the second inflow hole Ih2 through the second nozzle 121. The third nozzle 131 may be provided on and in fluid communication with the third inflow hole Ih3 and may be coupled to the bottom surface of the housing H1. The third nozzle 131 may connect the third inflow hole Ih3 to the third conduit 13 (i.e., cause fluid communication between the third inflow hole Ih3 and the third conduit 13). The gas may be supplied from the third inflow hole Ih3 through the third nozzle 131.

The first conduit 11 may be connected to and in fluid communication with the first inflow hole Ih1 through the first nozzle 111. Gas, which is supplied through the first inflow hole Ih1, may be transferred to the second connecting portion 143 through the first conduit 11. The second conduit 12 may be connected to and in fluid communication with the second inflow hole Ih2 through the second nozzle 121. Gas, which is supplied through the second inflow hole Ih2, may be transferred to the first connecting portion 141 through the second conduit 12. The third conduit 13 may be connected to and in fluid communication with the third inflow hole Ih3 through the third nozzle 131. Gas, which is supplied through the third inflow hole Ih3, may be transferred to the first connecting portion 141 through the third conduit 13.

The first connecting portion 141 may connect the second conduit 12 to the third conduit 13 and cause fluid communication therebetween. The second conduit 12, the third conduit 13, and the connection conduit 15 may meet each other at the first connecting portion 141. In an embodiment, the first connecting portion 141 may be a T-shaped connecting pipe.

The connection conduit 15 may be connected to the second conduit 12 and the third conduit 13 and cause fluid communication therebetween. The connection conduit 15 may connect the first connecting portion 141 to the second connecting portion 143 and cause fluid communication therebetween.

The valve 151 may be coupled to and in fluid communication with the connection conduit 15. A flow of gas, which flows from the first connecting portion 141 toward the second connecting portion 143, may be allowed or blocked or otherwise regulated by an on/off operation of the valve 151.

The second connecting portion 143 may connect the connection conduit 15 to the first conduit 11 and cause fluid communication therebetween. The connection conduit 15, the first conduit 11, and the measurement conduit 17 may meet each other at the second connecting portion 143. In an embodiment, the second connecting portion 143 may be a T-shaped connecting pipe.

The measurement conduit 17 may be extended from the second connecting portion 143 in a specific direction. Gas flowing through the measurement conduit 17 may be exhausted through a conduit end 171. In other words, the gas, which is supplied through the first inflow hole Ih1, the second inflow hole Ih2, and/or the third inflow hole Ih3, may be exhausted to the internal space Hs through the conduit end 171 of the measurement conduit 17. The gas may stay in the internal space Hs for a certain period of time and then may be exhausted to the outer space through the outflow hole Oh and the exhaust hole Eh (e.g., see FIG. 2).

The branch conduit 16 may be connected to and in fluid communication with the measurement conduit 17. More specifically, the branch conduit 16 may be divided from the measurement conduit 17. A fraction of the gas flowing through the measurement conduit 17 may be supplied to the branch conduit 16. The gas supplied to the branch conduit 16 may be exhausted to the internal space Hs through an end of the branch conduit 16.

The additional flow-rate measuring sensor 18 may be coupled to and in fluid communication with the branch conduit 16. The additional flow-rate measuring sensor 18 may measure a flow rate of gas flowing through the branch conduit 16. The additional flow-rate measuring sensor 18 may transmit a signal to the measurement pump 173.

The particle measuring sensor 19 may be a sensor that is configured to measure an amount of particles in fluid. For example, the particle measuring sensor 19 may include a light emitting part and a light sensing part, which are used to measure a concentration of particles in fluid. In an embodiment, the particle measuring sensor 19 may include a particle counter, a dust indicator, or the like. However, the inventive concept is not limited to these examples. The particle measuring sensor 19 may be coupled to and in fluid communication with the measurement conduit 17. The particle measuring sensor 19 may measure an amount of particles in the gas flowing through the measurement conduit 17. In other words, the particle measuring sensor 19 may be placed behind a region, in which the gases supplied through the three inflow holes Ih1, Ih2, and Ih3 are mixed, and thus, it may be used to measure a concentration of particles in the mixed gas flow. The particle measuring sensor 19 may be driven by power supplied from the power supplying part. The particle measuring sensor 19 may transmit the measurement data to the control unit C (e.g., see FIG. 1).

The measurement pump 173 may be coupled to and in fluid communication with the measurement conduit 17. For example, the measurement pump 173 may be coupled to the conduit end 171. The measurement pump 173 may produce a pressure capable of transferring the gas in the measurement conduit 17 toward the particle measuring sensor 19. In other words, the measurement pump 173 may produce a pressure, which prevents the gas in the measurement conduit 17 from being wholly exhausted to the branch conduit 16, and thus, a portion of the gas may be moved toward the particle measuring sensor 19. The measurement pump 173 may receive signals from the additional flow-rate measuring sensor 18. More specifically, the measurement pump 173 may receive the signals the additional flow-rate measuring sensor 18 through the board. For example, if a signal from the additional flow-rate measuring sensor 18 is provided to the board, the board may supply a power to the measurement pump 173 to drive the measurement pump 173. Thus, the measurement pump 173 may be driven by the signal transmitted from the additional flow-rate measuring sensor 18. In certain cases, it may be necessary to supply the gas to the particle measuring sensor 19 at a sufficiently high flow rate. For example, if the gas is supplied to the particle measuring sensor 19 at a very low flow rate, the measurement using the particle measuring sensor 19 may become inaccurate. In addition, if the gas is supplied to the particle measuring sensor 19 at a very high flow rate, the particle measuring sensor 19 may malfunction. In an embodiment, the measurement pump 173 may be controlled to supply the gas to the particle measuring sensor 19 at a proper flow rate. For this, the measurement pump 173 may receive information on the flow rate of the gas from the particle measuring sensor 19 and may be configured to supply the gas to the particle measuring sensor 19 at an appropriate flow rate.

The power supplying part (not shown) may supply electric power to the particle measuring sensor 19 and the transceiver. In an embodiment, the power supplying part may include a battery.

The board (not shown) may be electrically connected to the power supplying part, the particle measuring sensor 19, the additional flow-rate measuring sensor 18, the measurement pump 173, and the transceiver. The board may be configured to control them. For example, the board may drive the measurement pump 173 using the power supplying part, in response to signals provided from the additional flow-rate measuring sensor 18. The board may transfer signals, which are provided from the particle measuring sensor 19, to the transceiver.

The transceiver (not shown) may be connected to the particle measuring sensor 19. More specifically, the transceiver may receive signals from the particle measuring sensor 19 through the board. The transceiver may transmit information, which is received from the particle measuring sensor 19, to the control unit C (e.g., see FIG. 1).

The tilt sensor (not shown) may measure a tilt of the housing H1. Information on the tilt of the housing H1 measured by the tilt sensor may be transmitted to the control unit C (e.g., see FIG. 1) through the transceiver.

Figure 5:
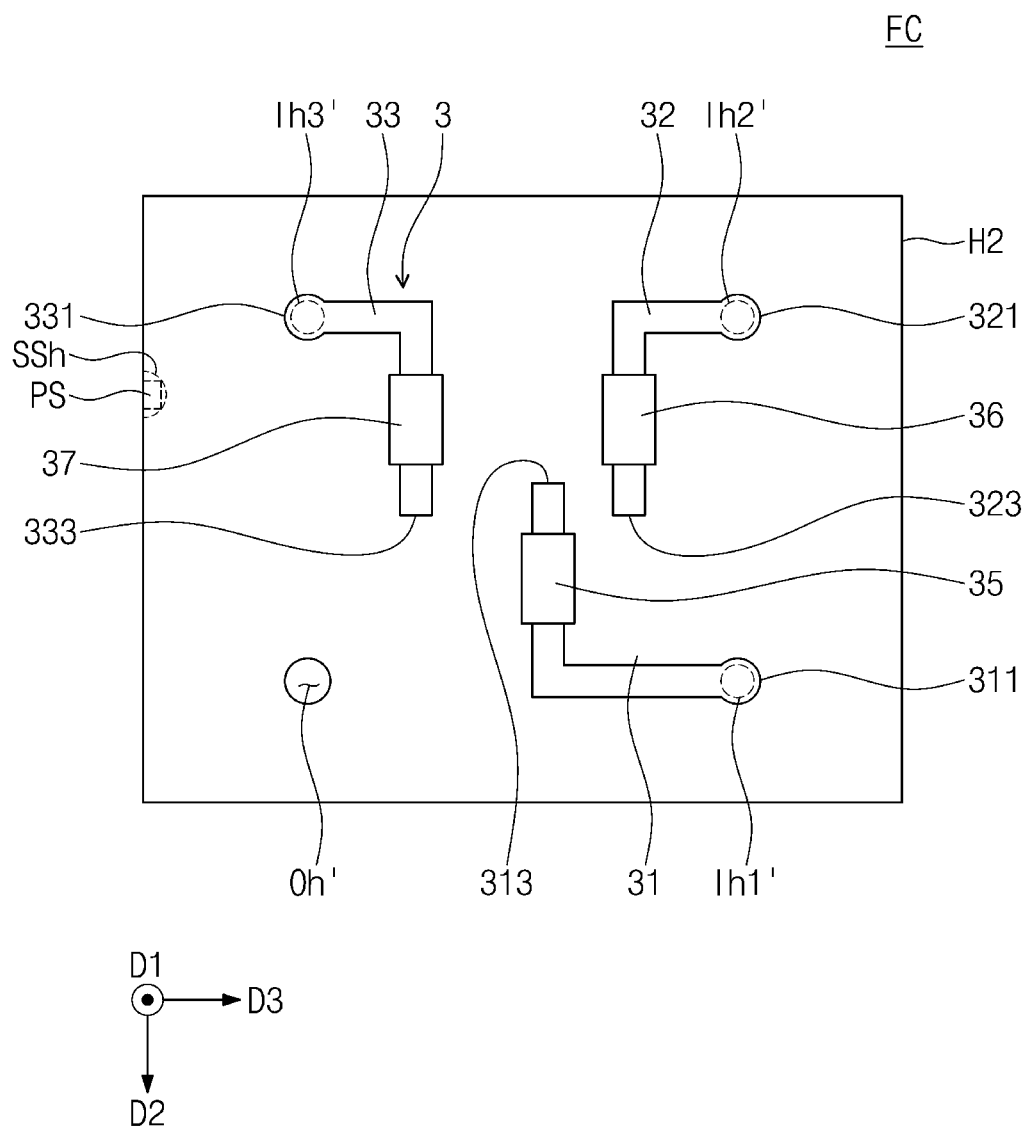
FIG. 5 is a plan view illustrating a flow-rate measure carrier, according to an embodiment of the inventive concept.

FIG. 5 is a plan view illustrating a flow-rate measure carrier according to an embodiment of the inventive concept.

Referring to FIG. 5, the flow-rate measure carrier FC may include a housing H2, a flow-rate measuring device 3, the power supplying part, the board, the transceiver, and the tilt sensor.

The housing H2 of the flow-rate measure carrier FC of FIG. 5 may be substantially the same as or similar to the housing H1 of the particle measure carrier PC described with reference to FIG. 4. In other words, an outer appearance of the flow-rate measure carrier FC may be defined by the housing H2. The housing H2 may have an internal space. A bottom surface of the housing H2 may be provided to have the first inflow hole Ih1', the second inflow hole Ih2', the third inflow hole Ih3', the outflow hole Oh', and a penetration hole SSh. The internal space may be connected to and in fluid communication with the outer space through the first inflow hole Ih1', the second inflow hole Ih2', the third inflow hole Ih3', and the outflow hole Oh'. More specifically, the internal space may be connected to and in fluid communication with a space below the housing H2 through the first inflow hole Ih1', the second inflow hole Ih2', the third inflow hole Ih3', and the outflow hole Oh'. In the case where the flow-rate measure carrier FC is placed on the carrier base E (e.g., see FIG. 2), each of the inflow holes may be connected to and in fluid communication with a corresponding one of the supply holes. The outflow hole Oh' may be connected to and in fluid communication with the exhaust hole Eh. Gas may be supplied into the internal space through the supply holes and the inflow holes. An example in which three inflow holes are provided has been described, but the inventive concept is not limited to this example. For example, the number of the inflow holes may be one, two, four or more. The penetration hole SSh may be provided through a side surface of the housing H2. The penetration hole SSh may be provided to penetrate the side surface of the housing H2 in a horizontal direction. The penetration hole SSh may connect an internal space of the housing H2 to the outer space. A differential pressure sensor PS may be located in the penetration hole SSh. The differential pressure sensor PS may be a sensor that is configured to sense a variation or value of pressure. The differential pressure sensor PS may be exposed to each of the internal space of the housing H2 and the outer space. Accordingly, the differential pressure sensor PS may sense a difference in pressure between the internal and outer spaces of the housing H2.

The flow-rate measuring device 3 may be placed in the internal space. The flow-rate measuring device 3 may be connected to and in fluid communication with the inflow hole. A flow rate of gas supplied into the internal space may be measured by the flow-rate measuring device 3. Information on the flow rate of gas, which is measured by the flow-rate measuring device 3, may be transmitted to the control unit C (e.g., see FIG. 1). The flow-rate measuring device 3 may include a first nozzle 311, a second nozzle 321, a third nozzle 331, a first conduit 31, a second conduit 32, a third conduit 33, a first flow-rate measuring sensor 35, a second flow-rate measuring sensor 36, and a third flow-rate measuring sensor 37.

The first nozzle 311 may be provided on and in fluid communication with the first inflow hole Ih1' and may be coupled to the bottom surface of the housing H2. The first nozzle 311 may connect the first inflow hole Ih1' to the first conduit 31 such that the first inflow hole Ih1' and the first conduit 31 are in fluid communication. The gas may be supplied from the first inflow hole Ih1' through the first nozzle 311. The second nozzle 321 may be provided on and in fluid communication with the second inflow hole Ih2' and may be coupled to the bottom surface of the housing H2. The second nozzle 321 may connect the second inflow hole Ih2' to the second conduit 32 such that the second inflow hole Ih2' and the second conduit 32 are in fluid communication. The gas may be supplied from the second inflow hole Ih2' through the second nozzle 321. The third nozzle 331 may be provided on and in fluid communication with the third inflow hole Ih3' and may be coupled to the bottom surface of the housing H2. The third nozzle 331 may connect the third inflow hole Ih3' to the third conduit 33 such that the third inflow hole Ih3' and the third conduit 32 are in fluid communication. The gas may be supplied from the third inflow hole Ih3' through the third nozzle 331.

The first conduit 31 may be connected to and in fluid communication with the first inflow hole Ih1' through the first nozzle 311. The gas supplied through the first inflow hole Ih1' may be transferred to the first flow-rate measuring sensor 35 through the first conduit 31. The second conduit 32 may be connected to and in fluid communication with the second inflow hole Ih2' through the second nozzle 321. The gas supplied through the second inflow hole Ih2' may be transferred to the second flow-rate measuring sensor 36 through the second conduit 32. The third conduit 33 may be connected to and in fluid communication with the third inflow hole Ih3' through the third nozzle 331. The gas supplied through the third inflow hole Ih3' may be transferred to the third flow-rate measuring sensor 37 through the third conduit 33.

The first flow-rate measuring sensor 35 may be coupled to and in fluid communication with the first conduit 31. The first flow-rate measuring sensor 35 may measure a flow rate of gas, which flows through the first conduit 31. In other words, the first flow-rate measuring sensor 35 may measure a flow rate of gas supplied through the first nozzle 311. The gas, which passes through the first flow-rate measuring sensor 35, may be exhausted to the internal space through a first conduit end 313.

The second flow-rate measuring sensor 36 may be coupled to and in fluid communication with the second conduit 32. The second flow-rate measuring sensor 36 may measure a flow rate of gas flowing through the second conduit 32. In other words, the second flow-rate measuring sensor 36 may measure a flow rate of gas supplied through the second nozzle 321. The gas, which passes through the second flow-rate measuring sensor 36, may be exhausted to the internal space through a second conduit end 323.

The third flow-rate measuring sensor 37 may be coupled to and in fluid communication with the third conduit 33. The third flow-rate measuring sensor 37 may measure a flow rate of gas flowing through the third conduit 33. In other words, the third flow-rate measuring sensor 37 may measure a flow rate of gas supplied through the third nozzle 331. The gas, which passes through the third flow-rate measuring sensor 37, may be exhausted to the internal space through a third conduit end 333.

Each of the first to third flow-rate measuring sensors 35, 36, and 37 may be configured to sense a flow rate of fluid. Various types of flowmeters, which can measure a fluid flow rate, may be used as the flow-rate measuring sensor. For example, the flow-rate measuring sensor may include a differential pressure flowmeter, a laminar flowmeter, an area flowmeter, an ultrasonic flowmeter, a turbine flowmeter, a positive displacement flowmeter, a vortex flowmeter, or an orifice flowmeter, but the inventive concept is not limited to these examples.

Power may be applied to each of the first to third flow-rate measuring sensors 35, 36, and 37 from the power supplying part. Each of the first to third flow-rate measuring sensors 35, 36, and 37 may transmit measurement information to the control unit C (e.g., see FIG. 1).

Each of the power supplying part (not shown), the board (not shown), the transceiver (not shown), and the tilt sensor (not shown) may be substantially the same as or similar to that described with reference to FIG. 4.

Figure 6:
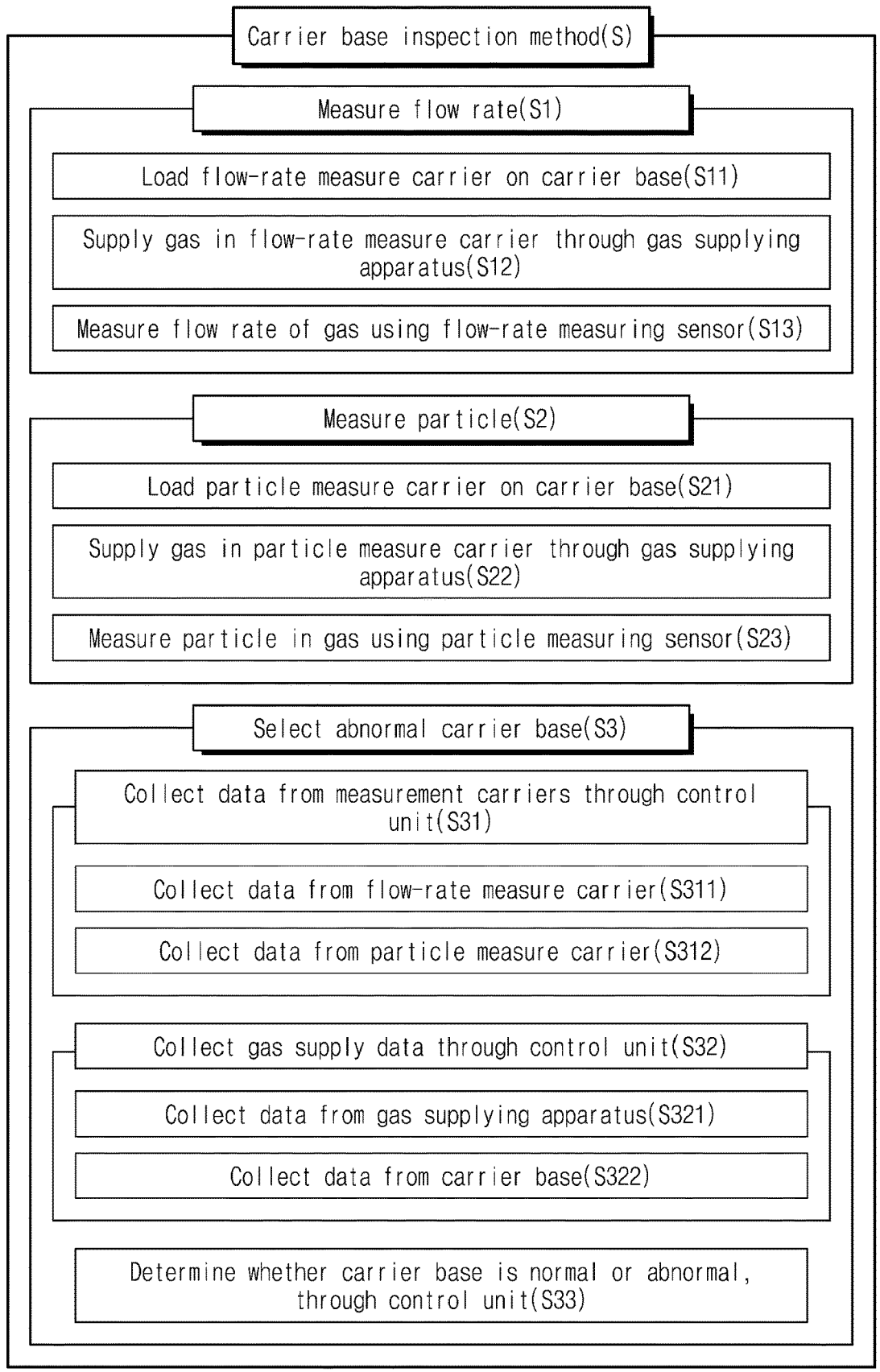
FIG. 6 is a flow chart illustrating a carrier base inspection method according to an embodiment of the inventive concept.

FIG. 6 is a flow chart illustrating a carrier base inspection method according to an embodiment of the inventive concept.

Referring to FIG. 6, a carrier base inspection method S may be provided. The carrier base inspection method S may be used to inspect a state of gas supplied through the carrier base E (e.g., see FIG. 1). The carrier base inspection method S may include measuring a flow rate (in S1), measuring particles (in S2), and selecting an abnormal carrier base (in S3).

The measuring of the flow rate (in S1) may include loading a flow-rate measure carrier on a carrier base (in S11), supplying gas in the flow-rate measure carrier through a gas supplying apparatus (in S12), and measuring a flow rate of gas using a flow-rate measuring sensor (in S13).

The measuring of the particles (in S2) may include loading a particle measure carrier on the carrier base (in S21), supplying gas in the particle measure carrier through the gas supplying apparatus (in S22), and measuring particles in the gas using a particle measuring sensor (in S23).

The selecting of the abnormal carrier base (in S3) may include collecting data from measurement carriers through a control unit (in S31), collecting gas supply data through the control unit (in S32), and determining whether a carrier base is normal or abnormal, through the control unit (in S33).

The collecting of the data from measurement carriers through the control unit (in S31) may include collecting data from the flow-rate measure carrier (in S311) and collecting data from the particle measure carrier (in S312).

The collecting of the gas supply data through the control unit (in S32) may include collecting data from the gas supplying apparatus (in S321) and collecting data from the carrier base (in S322). Hereinafter, each step of the carrier base inspection method S will be described in more detail with reference to FIGS. 1 to 6.

Referring to FIGS. 1, 2, 5, and 6, the loading of the flow-rate measure carrier on the carrier base (in S11) may include placing the flow-rate measure carrier FC (e.g., see FIG. 5) on the top surface Eu of the carrier base E. As shown in FIG. 1, the transfer device A may load the flow-rate measure carrier FC on the carrier base E via the port P while moving along the rail R. Each of the inflow holes Ih1', Ih2', and Ih3' (e.g., see FIG. 5) of the flow-rate measure carrier FC may be connected to and in fluid communication with a corresponding one of the supply holes Sh1, Sh2, and Sh3 of the carrier base E (e.g., see FIG. 2). The outflow hole Oh' of the flow-rate measure carrier FC may be connected to and in fluid communication with the exhaust hole Eh of the carrier base E.

Referring to FIGS. 3, 5, and 6, the supplying of the gas in the flow-rate measure carrier through the gas supplying apparatus (in S12) may include injecting the gas, which is supplied from the gas supplying apparatus G, into the flow-rate measure carrier FC through the supply holes Sh1, Sh2, and Sh3 (e.g., see FIG. 2) and the inflow holes Ih1', Ih2', and Ih3' (e.g., see FIG. 5). An operation of the gas supplying apparatus G may be controlled by the control unit C (e.g., see FIG. 1).

Referring to FIGS. 5 and 6, the measuring of the flow rate of gas using the flow-rate measuring sensor (in S13) may include supplying the gas, which is supplied through the first nozzle 311, to the first flow-rate measuring sensor 35 through the first conduit 31. The first flow-rate measuring sensor 35 may measure a flow rate of gas flowing through the first conduit 31. In addition, the measuring of the flow rate of gas using the flow-rate measuring sensor (in S13) may include supplying the gas, which is supplied through the second nozzle 321, to the second flow-rate measuring sensor 36 through the second conduit 32. The second flow-rate measuring sensor 36 may measure a flow rate of gas flowing through the second conduit 32. Furthermore, the measuring of the flow rate of gas using the flow-rate measuring sensor (in S13) may include supplying the gas, which is supplied through the third nozzle 331, to the third flow-rate measuring sensor 37 through the third conduit 33. The third flow-rate measuring sensor 37 may measure a flow rate of gas flowing through the third conduit 33.

The loading of the particle measure carrier on the carrier base (in S21) may be substantially similar to the supplying of the gas in the flow-rate measure carrier through the gas supplying apparatus (in S12).

The supplying of the gas in the particle measure carrier through the gas supplying apparatus (in S22) may be substantially similar to the supplying of the gas in the flow-rate measure carrier through the gas supplying apparatus (in S12).

Referring to FIGS. 4 and 6, the measuring of the particles in the gas using the particle measuring sensor (in S23) may include measuring an amount of particles in the gas flowing through the measurement conduit 17, which is connected to the first conduit 11, the second conduit 12, and the third conduit 13, using the particle measuring sensor 19. The particle measuring sensor 19 may measure a concentration of particles, which are contained in the entire gas supplied through the three inflow holes Ih1, Ih2, and Ih3.

Referring to FIGS. 1, 5, and 6, the collecting of the data from the flow-rate measure carrier (in S311) may include identifying flow-rate measure carriers, collecting data from the flow-rate measuring sensor, and collecting data from the differential pressure sensor. The control unit C may identify and recognize the plurality of the flow-rate measure carriers FC separately. For example, the flow-rate measure carriers FC may have their own RFIDs (radio frequency identification tags), which can be separately recognized by the control unit C. The control unit C may receive measurement data from the flow-rate measure carrier FC. For example, each flow-rate measuring sensor may send data, which contain information on a flow rate of gas supplied through each inflow hole, to the control unit C through the transceiver of the flow-rate measure carrier FC. In addition, the control unit C may receive data, which contain information on a pressure difference between the internal and outer spaces of the flow-rate measure carrier FC, from the differential pressure sensor PS.

Referring to FIGS. 1, 2, 4, and 6, the collecting of the data from the particle measure carrier (in S312) may include identifying the particle measure carriers and collecting data from the particle measuring sensor. The control unit C may identify and recognize the plurality of the particle measure carriers PC separately. For example, the particle measure carriers PC may have their own RFIDs, which can be separately recognized by the control unit C. The control unit C may receive measurement data from the particle measure carrier PC. For example, the particle measuring sensor may send data, which contain information on a total amount of particles in the gas supplied through the three inflow holes, to the control unit C through the transceiver of the particle measure carrier PC.

Referring to FIGS. 1, 2, and 6, the collecting of the data from the gas supplying apparatus (in S321) may include collecting data from a supply pressure measuring sensor. As described with reference to FIG. 1, the supply pressure measuring sensor may be coupled to the regulator of the gas supplying apparatus G. The supply pressure measuring sensor may provide information on a pressure of gas, which is actually supplied by the gas supplying apparatus, to the control unit C.

The collecting of the data from the carrier base (in S322) may include collecting data on a position of the carrier base and collecting data from a base flow-rate measuring sensor. The control unit C may examine a position of each of the carrier bases E and may identify and recognize the carrier bases E separately. The control unit C may receive data from the base flow-rate measuring sensor. As described with reference to FIG. 2, the base flow-rate measuring sensor may be installed on the carrier base E. The base flow-rate measuring sensor may measure a flow rate of gas, which is exhausted from the carrier base E through the supply holes Sh1, Sh2, and Sh3 of the carrier base E, and may provide information on the measured flow rate to the control unit C.

The determining of whether the carrier base is normal or abnormal, through the control unit (in S33) may include determining a state of the carrier base, based on data received from the measurement carriers. For example, a state of the gas supplying apparatus G and/or the carrier base E may be determined based on the information on the particle amount received from the particle measuring sensor. If a concentration of detected particles is higher than a predetermined value, the gas supplying apparatus G and/or the carrier base E may be determined to be in an abnormal state. In addition, a state of the gas supplying apparatus G and/or the carrier base E may be determined based on the information on flow rate received from the flow-rate measuring sensor. If the measured flow rate is lower than a predetermined value, the gas supplying apparatus G and/or the carrier base E may be determined to be in an abnormal state. More specifically, if, in one flow-rate measure carrier, a flow rate measured by one of the flow-rate measuring sensors is within a normal range but a flow rate measured by another flow-rate measuring sensor is not within the normal range, the carrier base may be determined to be in a tilted state. Alternatively, this result may mean that there is a clogging or leakage issue in a conduit of a certain supplying device in the carrier base. Furthermore, the control unit C may compare the gas supply data with the data, which are obtained from the flow-rate measure carrier, to examine whether the gas is normally supplied from the gas supplying apparatus G (e.g., see FIG. 1) to the flow-rate measure carrier FC. In other words, by comparing a flow rate of gas, which is actually supplied by the gas supplying apparatus G, with a flow rate of gas, which is actually supplied into the flow-rate measure carrier, it may be possible to determine whether there is a problem in the connection between the gas supplying apparatus G, the carrier base E, and the flow-rate measure carrier. Since the collected data contain information on the position of the carrier base E, the position of the flow-rate measure carrier FC, and the position of the particle measure carrier PC, it may be possible to find which carrier base has the problem. An operator may execute a maintenance process on the problematic carrier base, on the basis on this information. In addition, by using the data received from the differential pressure sensor, it may be possible to determine a difference in pressure between the internal space and the outer space of the flow-rate measure carrier FC.

In the measurement carrier according to an embodiment of the inventive concept and the wafer transfer system including the same, in the case where the gas is supplied into the carrier through a plurality of inflow holes, the plurality of flow-rate measuring sensors may be used to measure flow rates of them respectively. Thus, it may be possible to obtain information on a flow rate of gas supplied through each of the inflow holes. Accordingly, if there is an abnormal gas flow, it may be possible to determine which inflow hole is causing the abnormal gas flow. Furthermore, these data may be used to obtain information on a tilting state of the carrier base or on a connection state between the carrier base and the carrier. An operator may execute a maintenance process based on this information.

In the measurement carrier according to an embodiment of the inventive concept and the wafer transfer system including the same, a conduit connected to the inflow hole may be further provided in the carrier. Since a flow rate of gas flowing through the conduit and/or an amount of particles in the gas are measured, it may be possible to stably perform the measurement process on the flowing gas. That is, it may be possible to perform the measurement process on gas, which flows through the conduit while forming a laminar flow, and thereby to obtain more accurate measurement results.

Figure 7:
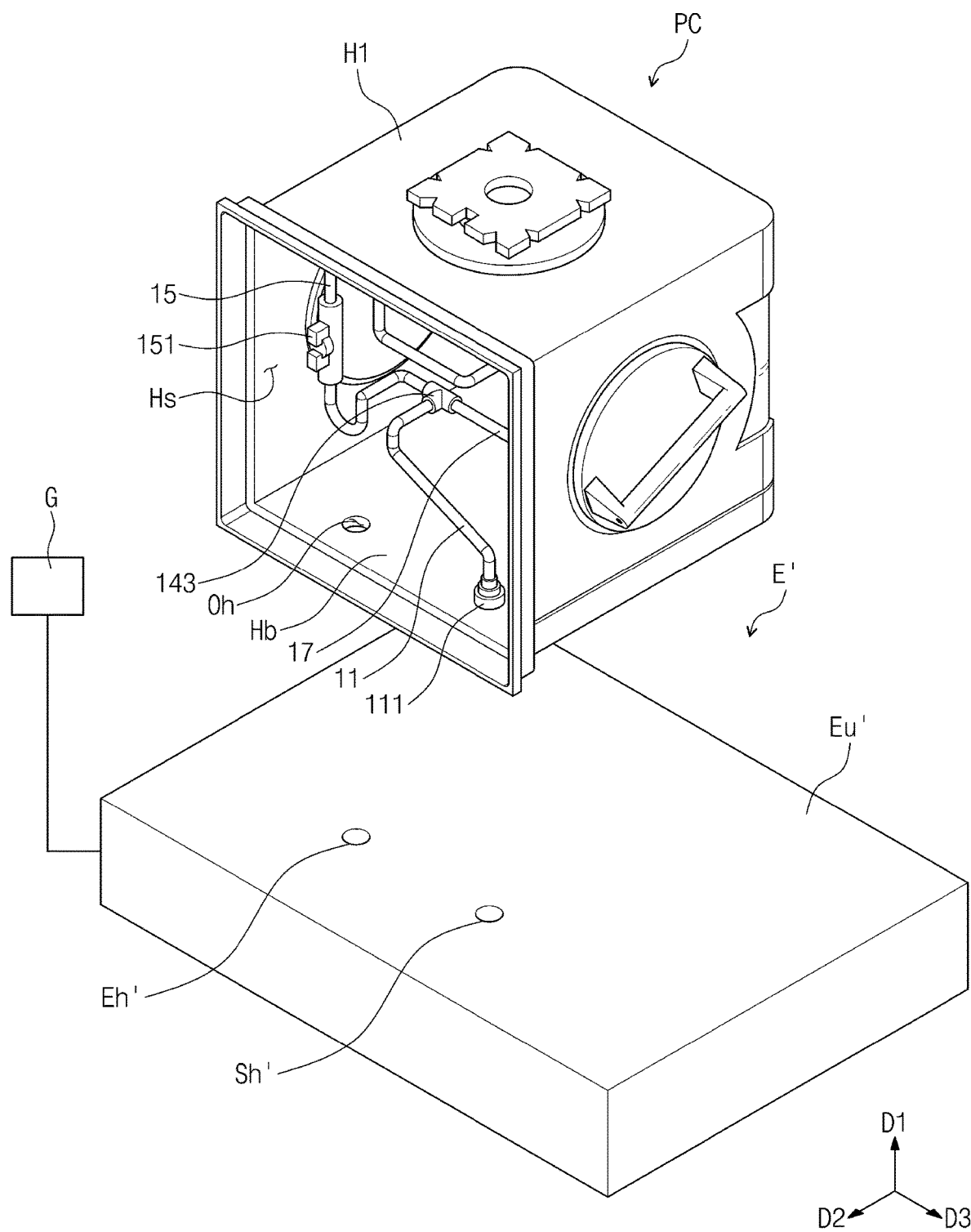
FIG. 7 is a perspective view illustrating a measurement carrier, which is loaded on a carrier base, according to an embodiment of the inventive concept.

FIG. 7 is a perspective view illustrating a measurement carrier, which is loaded on a carrier base, according to an embodiment of the inventive concept.

For concise description, an element previously described with reference to FIGS. 1A to 16 may be identified by the same reference number without repeating an overlapping description thereof.

Referring to FIG. 7, the carrier base E' may be provided to have only one supply hole Sh'. In other words, unlike that described with reference to FIG. 2, one supply hole Sh' and one exhaust hole Eh' may be merely provided on the top surface Eu' of the carrier base E'. The carrier base E' of this kind may be inspected using the particle measure carrier PC described with reference to FIG. 2.

In the measurement carrier according to an embodiment of the inventive concept and the wafer transfer system including the same, a valve may be installed on the particle measure carrier. Thus, by closing the valve, it may be possible to normally perform the inspection process, even when the carrier has three inflow holes and the carrier base has just one supply hole. In other words, a particle measurement process may be normally performed on various kinds of carrier bases, even when one kind of particle measure carrier is provided.

In a measurement carrier according to an embodiment of the inventive concept and a wafer transfer system including the same, it may be possible to measure an amount of particles in gas supplied into a carrier from a carrier base and to measure a flow rate of the gas.

In a measurement carrier according to an embodiment of the inventive concept and a wafer transfer system including the same, it may be possible to inspect a tilting state of the carrier base.

In a measurement carrier according to an embodiment of the inventive concept and a wafer transfer system including the same, it may be possible to inspect a connection state between the carrier base and the carrier.

In a measurement carrier according to an embodiment of the inventive concept and a wafer transfer system including the same, it may be possible to precisely measure an amount of particles in gas supplied into the carrier and a flow rate of the gas.

While example embodiments of the inventive concept have been particularly shown and described, it will be understood by one of ordinary skill in the art that variations in form and detail may be made therein without departing from the scope of the attached claims.

What is claimed is:

1. A measurement carrier, comprising:
a housing having an internal space; and
a flow-rate measuring device located within the internal space,
wherein a bottom surface of the housing comprises a first inflow hole, a second inflow hole, and an outflow hole, each of which is configured to provide fluid communication between the internal space and an outer space,
wherein the flow-rate measuring device comprises:
a first flow-rate measuring sensor in fluid communication with the first inflow hole; and
a second flow-rate measuring sensor in fluid communication with the second inflow hole.

2. The carrier of claim 1, wherein the flow-rate measuring device further comprises:
a first nozzle in fluid communication with the first inflow hole and coupled to the bottom surface of the housing;
a second nozzle in fluid communication with the second inflow hole and coupled to the bottom surface of the housing;
a first conduit connected to and in fluid communication with the first nozzle; and
a second conduit connected to and in fluid communication with the second nozzle,
wherein the first flow-rate measuring sensor is in fluid communication with the first conduit, and
the second flow-rate measuring sensor is in fluid communication with the second conduit.

3. The carrier of claim 1, wherein the flow-rate measuring device further comprises:
a power supply configured to provide power to the first flow-rate measuring sensor and the second flow-rate measuring sensor;
a transceiver configured to transmit signals from the first flow-rate measuring sensor and the second flow-rate measuring sensor to a control unit; and
a tilt sensor.

4. The carrier of claim 1, wherein the bottom surface of the housing further comprises a third inflow hole configured to provide fluid communication between the internal space and the outer space, and
the flow-rate measuring device further comprises a third flow-rate measuring sensor in fluid communication with the third inflow hole.

5. The carrier of claim 4, wherein the flow-rate measuring device further comprises:
  a third nozzle in fluid communication with the third inflow hole and coupled to the bottom surface of the housing; and
  a third conduit in fluid communication with the third nozzle,
  wherein the third flow-rate measuring sensor is in fluid communication with the third conduit.

6. The carrier of claim 1, wherein a side surface of the housing comprises a penetration hole configured to provide fluid communication between the internal space and the outer space, and
  the carrier further comprises a differential pressure sensor located within the penetration hole.

7. A measurement carrier, comprising:
  a housing having an internal space; and
  a particle measurement device located within the housing,
  wherein a bottom surface of the housing comprises a first inflow hole, a second inflow hole, a third inflow hole, and an outflow hole, each of which is configured to provide fluid communication between the internal space and an outer space, and
  the particle measurement device comprises:
    a first conduit in fluid communication with the first inflow hole;
    a second conduit in fluid communication with the second inflow hole;
    a third conduit in fluid communication with the third inflow hole;
    a measurement conduit in fluid communication with each of the first conduit, the second conduit, and the third conduit; and
    a particle measuring sensor in fluid communication with the measurement conduit.

8. The carrier of claim 7, wherein the particle measurement device further comprises:
  a connection conduit in fluid communication with the second conduit and the third conduit; and
  a valve in fluid communication with the connection conduit, wherein the valve is configured to control flow of a gas between the connection conduit and the measurement conduit,
  wherein the measurement conduit is in fluid communication with the connection conduit and the first conduit.

9. The carrier of claim 7, wherein the particle measurement device further comprises:
  a first nozzle coupled to the bottom surface of the housing and in fluid communication with the first inflow hole and the first conduit;
  a second nozzle coupled to the bottom surface of the housing and in fluid communication with the second inflow hole and the second conduit; and
  a third nozzle coupled to the bottom surface of the housing and in fluid communication with the third inflow hole and the third conduit.

10. The carrier of claim 7, wherein the particle measurement device further comprises:
  a branch conduit in fluid communication with the measurement conduit; and
  an additional flow-rate measuring sensor in fluid communication with the branch conduit.

11. The carrier of claim 10, wherein the particle measurement device further comprises a measurement pump in fluid communication with to the measurement conduit, wherein the measurement pump is configured to prevent gas in the measurement conduit from being entirely exhausted to the branch conduit.

12. The carrier of claim 11, wherein the measurement pump is driven based on a signal transmitted from the additional flow-rate measuring sensor.

13. A wafer transfer system, comprising:
  a carrier having an internal space;
  a transfer device configured to transfer the carrier;
  a carrier base configured to receive the carrier thereon; and
  a gas supplying apparatus in fluid communication with the carrier base and configured to supply a gas into the carrier,
  wherein the carrier comprises:
    a wafer carrier configured to receive a wafer;
    a flow-rate measure carrier configured to measure a flow rate of the gas; and
    a particle measure carrier configured to measure an amount of particles in the gas,
  the carrier base comprises a supply hole and an exhaust hole, each of which are in fluid communication with the gas supplying apparatus and are exposed near a top surface of the carrier base,
  each of the wafer carrier, the flow-rate measure carrier, and the particle measure carrier comprising a respective inflow hole configured to be in fluid communication with the supply hole and an outflow hole configured to be in fluid communication with the exhaust hole,
  the flow-rate measure carrier comprises a flow-rate measuring sensor, and
  the particle measure carrier comprises a particle measuring sensor.

14. The wafer transfer system of claim 13, further comprising a control unit,
  wherein each of the flow-rate measure carrier and the particle measure carrier further comprises a transceiver configured to transmit information to the control unit.

15. The wafer transfer system of claim 13, wherein a number of the supply hole in the carrier base is two or more, and
  a number of the inflow hole in each of the wafer carrier, the flow-rate measure carrier, and the particle measure carrier is two or more.

16. The wafer transfer system of claim 15, wherein the flow-rate measure carrier comprises a plurality of flow-rate measuring sensors in fluid communication with the two or more inflow holes, respectively, and
  the particle measure carrier comprises a particle measuring sensor in fluid communication with the two or more inflow holes.

17. The wafer transfer system of claim 13, wherein the carrier base further comprises a base flow-rate measuring sensor in fluid communication with the supply hole.

18. The wafer transfer system of claim 17, wherein the carrier base is provided in plural, and
  the gas supplying apparatus is in fluid communication with each of the plurality of carrier bases and is configured to supply gas to each of the plurality of carrier bases.

19. The wafer transfer system of claim 18, wherein the gas supplying apparatus comprises a supply pressure measuring sensor.

20. The wafer transfer system of claim 13, wherein the wafer carrier is provided in plural,
  the flow-rate measure carrier is provided in plural,
  the particle measure carrier is provided in plural, and ae number of the wafer carriers is greater than a number of the flow-rate measure carriers and a number of the particle measure carriers.

\* \* \* \* \*